US012585182B2

(12) United States Patent
Best et al.

(10) Patent No.: US 12,585,182 B2
(45) Date of Patent: Mar. 24, 2026

(54) OVERLAY CORRECTION FOR ADVANCED INTEGRATED-CIRCUIT DEVICES

(71) Applicant: Onto Innovation Inc., Wilmington, MA (US)

(72) Inventors: Keith F. Best, Andover, MA (US); John Chang, Taichung (TW)

(73) Assignee: Onto Innovation Inc., Wilmington, MA (US)

( * ) Notice: Subject to any disclaimer, the term of this patent is extended or adjusted under 35 U.S.C. 154(b) by 153 days.

(21) Appl. No.: 18/390,424

(22) Filed: Dec. 20, 2023

(65) Prior Publication Data

US 2024/0219825 A1     Jul. 4, 2024

Related U.S. Application Data

(60) Provisional application No. 63/477,694, filed on Dec. 29, 2022.

(51) Int. Cl.
*G03F 1/72*        (2012.01)
*G03F 1/84*        (2012.01)
*G03F 7/20*        (2006.01)

(52) U.S. Cl.
CPC ................. *G03F 1/72* (2013.01); *G03F 1/84* (2013.01); *G03F 7/2022* (2013.01)

(58) Field of Classification Search
CPC ............. G03F 1/72; G03F 1/84; G03F 7/2022
See application file for complete search history.

(56) References Cited

U.S. PATENT DOCUMENTS 5,444,538 A * 8/1995 Pellegrini ........... G03F 7/70633
                                                    355/53
7,241,541 B2 * 7/2007 Tsai ...................... G03F 7/0035
                                                    430/30
(Continued)

FOREIGN PATENT DOCUMENTS

CN          109863457          6/2019
JP          2012204833         10/2012
(Continued)

OTHER PUBLICATIONS

"International Application Serial No. PCT US2023 085066, International Search Report mailed Apr. 24, 2024", 3 pgs.
(Continued)

*Primary Examiner* — Hung V Nguyen
(74) *Attorney, Agent, or Firm* — Schwegman Lundberg & Woessner, P.A.

(57)            ABSTRACT

Various examples described herein include a correction for a layer-to-layer or substrate-to-substrate overlay alignment based upon feedback from critical-dimension (CD) measurements of locations of various features that are to be formed on subsequently formed layers of a substrate with regard to locations of similar features on previously formed layers. The layer-to-layer or substrate-to-substrate overlay-alignment feedback can be enhanced by determining positions of multiple ones of the features on each of the formed layers with respect to the first layer in the stack. Further, the layer-to-layer or substrate-to-substrate overlay-alignment feedback can be enhanced by determining positions of multiple ones of the features on each of the formed layers with respect to the previously formed layer. Overlay-alignment errors may be sent back to a photolithographic exposure tool. An accumulated overlay error can be flagged. Other techniques and methods are also disclosed.

20 Claims, 4 Drawing Sheets

(56) References Cited

U.S. PATENT DOCUMENTS

| | | | | |
|---|---|---|---|---|
| 11,092,901 | B2 * | 8/2021 | Buhl | G03F 7/70525 |
| 11,392,045 | B2 * | 7/2022 | Wang | G03F 7/70633 |
| 11,809,090 | B2 * | 11/2023 | Golotsvan | G01N 21/956 |
| 11,874,102 | B2 * | 1/2024 | Guo | G03F 7/70683 |
| 2019/0043722 | A1 | 2/2019 | Kobayashi | |
| 2021/0082870 | A1 | 3/2021 | Wu et al. | |
| 2021/0333701 | A1 | 10/2021 | Lee et al. | |
| 2022/0068688 | A1 | 3/2022 | Jo et al. | |
| 2022/0406747 | A1 | 12/2022 | Nihei | |

FOREIGN PATENT DOCUMENTS

| | | |
|---|---|---|
| TW | 202032256 | 9/2020 |
| TW | 202043949 | 12/2020 |
| TW | 202129427 | 8/2021 |
| TW | 202209018 | 3/2022 |
| TW | 202427074 | 7/2024 |
| WO | 2024145105 | 7/2024 |

OTHER PUBLICATIONS

"International Application Serial No. PCT US2023 085066, Written Opinion mailed Apr. 24, 2024", 4 pgs.
"Taiwanese Application Serial No. 112150298, Office Action mailed Jan. 8, 2025", with manual English translation, 14 pages.
"Taiwanese Application Serial No. 112150298, Response filed Mar. 19, 2025 to Office Action mailed Jan. 8, 2025", with English claims, 15 pages.

* cited by examiner

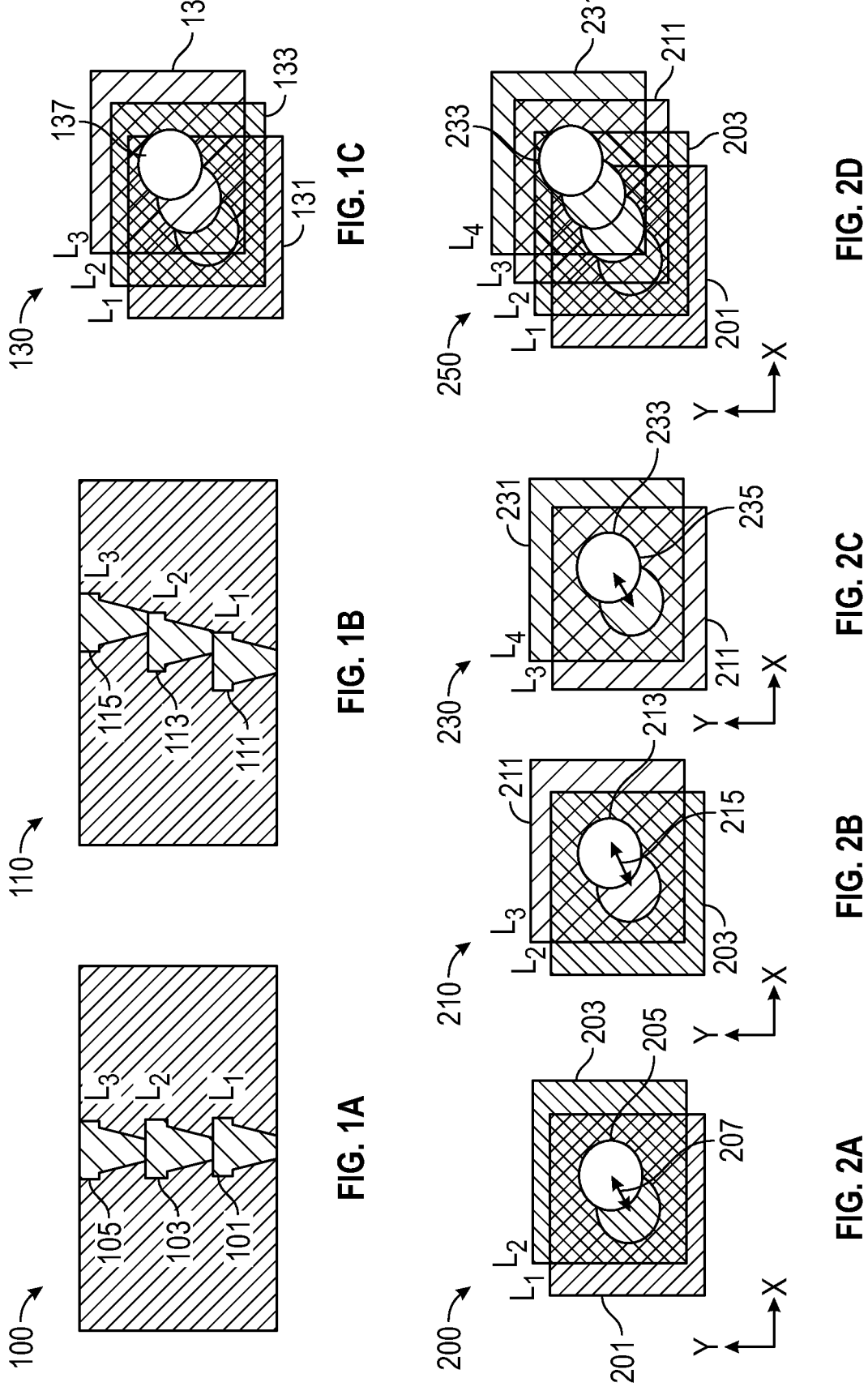

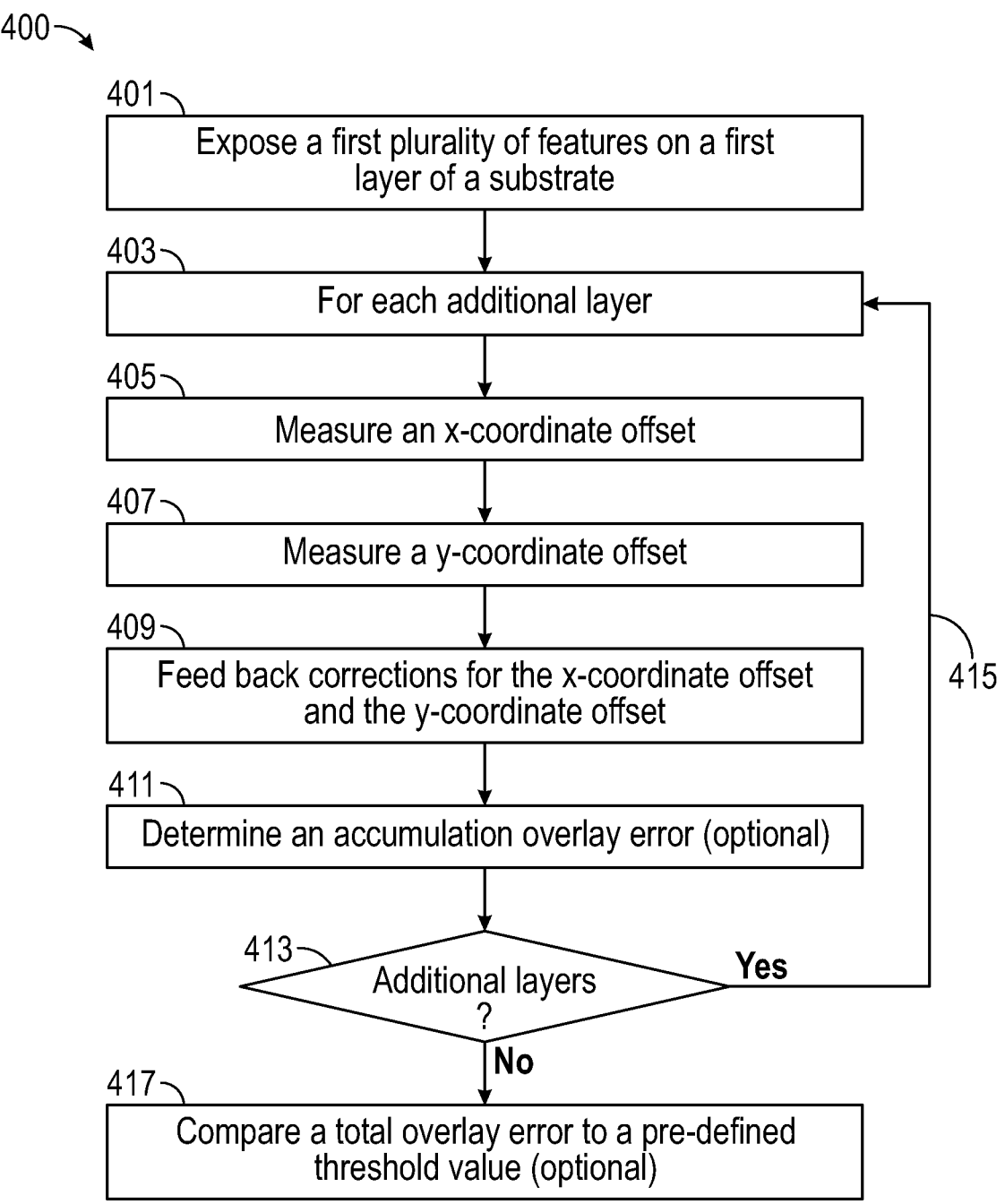

400

401 — Expose a first plurality of features on a first layer of a substrate

403 — For each additional layer

405 — Measure an x-coordinate offset

407 — Measure a y-coordinate offset

409 — Feed back corrections for the x-coordinate offset and the y-coordinate offset 411 — Determine an accumulation overlay error (optional)

413 — Additional layers ?

Yes

415

No

417 — Compare a total overlay error to a pre-defined threshold value (optional)

FIG. 4

OVERLAY CORRECTION FOR ADVANCED INTEGRATED-CIRCUIT DEVICES

CLAIM OF PRIORITY

This application claims the priority benefit to U.S. Provisional Patent Application Ser. No. 63/477,694, filed on 29 Dec. 2022, and entitled "OVERLAY CORRECTION FOR ADVANCED INTEGRATED-CIRCUIT DEVICES," which is hereby incorporated by reference herein in its entirety.

TECHNOLOGY FIELD

The disclosed subject-matter is related generally to the field of semiconductor and allied industries (e.g., flat-panel display and solar-cell production facilities). More specifically, in various embodiments, the disclosed subject-matter is related to aligning subsequent layers formed on a substrate used to fabricate, for example, integrated-circuit devices.

BACKGROUND

Current process flows for advanced integrated-circuit device production are comprised of up to, for example, twelve redistribution layers (RDL) and twelve via layers. In various process flows, the via layers are layers that are drilled, etched, or otherwise formed through respective layers to couple electrically one layer to a subsequently-formed layer. The twelve RDLs and the twelve via layers, in this example, may be repeated on both sides of a substrate on which the IC devices are being formed. However, as the number of process layers increases, x-coordinate locations and y-coordinate locations (e.g., with reference to a plane of a substrate on which the devices are formed) can be distorted (incorrectly located) from one layer to a subsequent layer on the substrate. This distortion can be caused by, for example, heating cycles during curing operations in processes such as, for example, Ajinomoto Build-up Film (ABF) layers.

SUMMARY

This document describes, among other things, various types of techniques, methods, and mechanisms to track and correct alignment errors of integrated circuits formed on a substrate. For example, in various embodiments, the disclosed subject-matter is a method to perform measurements and track dx- and dy-displacement errors, per layer, of a selected subset or every one of the redistribution layers (RDL) and via features on the substrate with respect to exposed locations on the first layer. In alternative embodiments, the disclosed subject-matter compares the dx-displacement error and the dy-displacement error to an original planned layout of the substrate that has defined x-coordinates and y-coordinates for each feature (e.g., redistribution layers (RDL) and via features) to be formed on various layers.

In various embodiments described herein, a method for correcting overlay errors in a multi-layer process is disclosed. The method includes exposing a first plurality of features on a first layer of a substrate. The exposing is performed by a photolithographic exposure tool. For at least one of a plurality of additional layers formed over the first layer: measuring an x-coordinate offset and a y-coordinate offset of a subsequent plurality of features on a subsequent layer with reference to a same location of at least one of various locations of the first plurality of features and defined x-coordinates and y-coordinates for the first plurality of features on the substrate. The method further includes feeding back corrections for the x-coordinate offset and the y-coordinate offset of the subsequent plurality of features to the photolithographic exposure tool prior to exposing a further subsequent layer.

In various embodiments described herein, a system to correct overlay errors in a multi-layer process is disclosed. The system includes a photolithographic exposure tool to expose a first plurality of features on a first layer of a substrate. For at least one of a plurality of additional layers formed over the first layer: a metrology-based measurement tool measures an x-coordinate offset and a y-coordinate offset of a subsequent plurality of features on a subsequent layer with reference to a same location of at least one of various locations of the first plurality of features and defined x-coordinates and y-coordinates for the first plurality of features on the substrate. At least one calculation module is used to feed corrections for the x-coordinate offset and the y-coordinate offset of the subsequent plurality of features back to the photolithographic exposure tool prior to exposing a further subsequent layer.

BRIEF DESCRIPTION OF FIGURES

Various ones of the appended drawings merely illustrate example implementations of the present disclosure and should not be considered as limiting its scope.

FIG. 1A shows a cross-sectional view of a portion of an integrated-circuit device structure having features that are aligned with each other;

FIG. 1B shows a cross-sectional view of a portion of an integrated-circuit device structure having progressively misaligned features per layer, indicating an accumulation of misalignment in the structure;

FIG. 1C shows a plan view of the portion of the integrated-circuit device structure of FIG. 1B having progressively misaligned features, layer-to-layer, as indicated by the cross-sectional view of FIG. 1B;

FIG. 2A shows a plan view of a portion of an integrated-circuit device structure having misaligned overlay occurring from a first layer to a second layer;

FIG. 2B shows a plan view of the portion of the integrated-circuit device structure of FIG. 2A, having misaligned overlay occurring from the second layer of FIG. 2A to a third layer;

FIG. 2C shows a plan view of the portion of the integrated-circuit device structure of FIG. 2B, having misaligned overlay occurring from the third layer of FIG. 2B to a fourth layer;

FIG. 2D shows a plan view of the portion of the integrated-circuit device structure of FIG. 2A through FIG. 2C, having progressively misaligned overlays occurring from the first layer of FIG. 2A through the fourth layer of FIG. 2C;

FIG. 4 is an exemplary flowchart of a method for aligning overlay features on subsequent layers.

DETAILED DESCRIPTION

Figure 3:
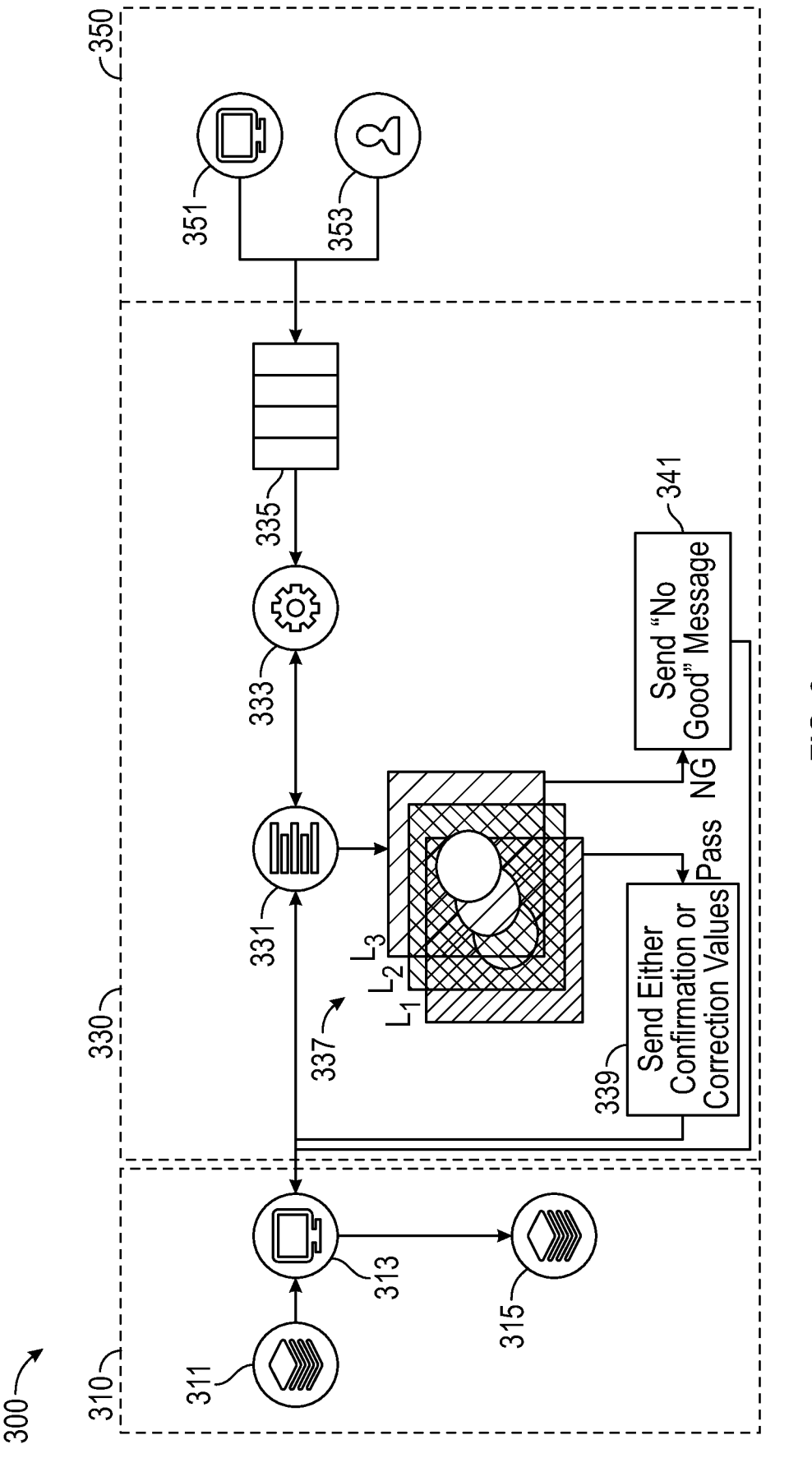
FIG. 3 shows an example of a method incorporated into a fabrication environment to reduce or eliminate misaligned overlays of features in accordance with various embodiments of the disclosed subject-matter.

The disclosed subject-matter is directed to providing alignment of features formed on subsequent layers of a substrate used to form, for example, integrated-circuit (IC) devices within a fabrication facility (e.g., a semiconductor fabrication facility). In various ones of the embodiments, various mechanisms, techniques, and methods to provide overlay correction, from layer-to-layer as well as substrate-to-substrate, for the IC device are disclosed.

In the disclosed subject-matter, a correction for layer-to-layer overlay alignment can be improved based upon feedback from critical-dimension (CD) measurements of locations of various features that are to be formed on subsequently formed layers of a substrate with regard to locations of similar features on previously formed layers. However, the layer-to-layer overlay-alignment feedback can be enhanced by determining positions of multiple ones of the features on each of the formed layers with respect to the first layer in the stack (e.g., comparing positions of features on each of layers 2 through 12 to positions of similar or related features on layer 1). Further, the layer-to-layer overlay-alignment feedback can be enhanced by determining positions of multiple ones of the features on each of the formed layers with respect to the previously formed layer (e.g., comparing positions of features on layer 8 to positions of similar features on layer 7).

Consequently, for each formed layer, the CD measurements of locations of features on a subsequent layer with regard to either (1) locations of similar or related features on the first layer; and/or (2) locations of features on a subsequent layer with regard to defined (e.g., planned) x-coordinates and y-coordinates for the first plurality of features on the substrate (planned x-y locations of each of the multiple features on the first layer) can be determined.

Maintaining a vertically-stacked RDL and via structure helps minimize or reduce an interconnect resistance between contacts (e.g., a value of resistance between interconnect vias or RDL contacts) on subsequent layers. For example, over twelve layers of RDL and vias, a total overlay-error (e.g., dx- and dy-coordinate offsets (e.g., displacement errors)) as compared with the first layer) could be considerable, even though the performance of one layer to the next (e.g., a layer-to-layer performance) may be acceptable. In a typical IC device in this example, the total overlay-error could be up to twelve times a layer-to-layer overlay error as offset errors are often cumulative since the positional errors tend to occur in the same general directions from layer-to-layer. However, even if the positional errors are not in the same direction from layer-to-layer, the disclosed subject-matter can help minimize or reduce, for example, an interconnect resistance between contacts In various embodiments, the disclosed subject-matter includes a method to perform measurements and track the dx- and dy-displacement errors, per layer, of a selected subset of, for example, RDLs and via, or every RDL and via feature, on the substrate with respect to locations on the first layer. In alternative embodiments, the disclosed subject-matter compares the dx-displacement error and the dy-displacement error to an original planned layout of the substrate that has defined x-coordinates and y-coordinates for each feature to be formed on various layers.

From these data that are gleaned either from metrological measurements and/or planned positional-locations, the cumulative total-overlay-error can be calculated. The cumulative total-overlay-error can be compared against a pre-defined threshold value (e.g., a pre-define threshold error value), which when exceeded will inform the user and identify regions of the substrate that are affected. Consequently, prior to etching the exposed feature (or prior to etching the unexposed features, depending upon whether a positive-resist or a negative-resist process is used), the measured error can be compared to the pre-determined threshold value for possible rework, or for additions as an offset sent to a photolithographic tool for fabrication of subsequent substrates having the same types of IC devices formed thereon. These calculated dx- and dy-offset values can be used to compensate for the displacement errors and bring the RDL/via total stack-overlay within specification for either rework or subsequent substrate fabrication.

As used herein, a substrate may comprise, for example, a variety of substrate-types used in the semiconductor and allied fields (e.g., flat-panel displays, solar-cell panels, etc.) as well as other technical fields (e.g., quartz photomask production, production of ceramic windows for radiation monitoring, etc.). In the semiconductor field, the substrate may comprise an elemental (e.g., silicon or germanium) semiconductor, a compound semiconductor (e.g., silicon carbide, gallium arsenide, or indium gallium arsenide), or various types of polymer resins (e.g., polyethylene-terephthalate (PET) having films deposited thereon or otherwise formed with a semiconducting layer), or numerous other types of substrates known independently in the art.

With reference now to FIG. 1A, a cross-sectional view of an aligned-version of an overlay structure 100 having features that are aligned with each other, from layer-to-layer, is shown. The overlay structure 100 may be a portion of an IC device. Since the features of FIG. 1A are shown from only a two-dimensional perspective, the overlay structure 100 can be considered to be viewed from either front-to-back or side-to-side with reference to a cross-section of the layers (layers $L_1$ through layer $L_3$) formed on a substrate. The distinction of FIG. 1A (e.g., with comparison to FIG. 1C, discussed below) is that the features are aligned in both directions (an x-direction and a y-direction). Consequently, the features are aligned in both directions with regard to a plane parallel (an x-y plane) to a surface of the substrate on which the layers are formed.

FIG. 1A is shown to include a first formed-feature 101 within a first layer 1 ($L_1$). The first formed-feature 101 can be considered to be, for example, either a via or a via that is formed and subsequently filled with a conductive substance, such as tungsten (W). A second formed-feature 103 (e.g., a second filled-via) is formed within a second layer ($L_2$) in vertical alignment with the first formed-feature 101. A third formed-feature 105 (e.g., a third filled-via) is formed within a third layer ($L_3$) in vertical alignment with both the immediately adjacent second formed-feature 103 and the further underlying first formed-feature 101. Since each of the subsequently formed features is vertically aligned with each of respective ones of the underlying features, an overall level of contact resistance is reduced or minimized.

In contrast to the overlay structure 100 of FIG. 1A, FIG. 1B shows a cross-sectional view of a portion of an integrated-circuit device structure 110 having progressively misaligned features per layer, indicating an accumulation of misalignment in the structure 110. The accumulated misalignment of features in the structure 110 results in an increased level of contact resistance (e.g., an interconnect resistance), both layer-to-layer as well as from the layers to a substrate, on which the structure 110 is formed, to a top layer (e.g., layer 12, not shown in FIG. 1B) of the structure 110.

FIG. 1B is shown to include a first formed-feature 111 within a first layer 1 ($L_1$). The first formed-feature 111 may be similar to or the same as the first formed-feature 101 of FIG. 1A (e.g., a filled via). A second formed-feature 113 (e.g., a second filled-via) is formed within a second layer ($L_2$), but is positionally misaligned with reference to the first formed-feature 111. A third formed-feature 115 (e.g., a third filled-via) is formed within a third layer ($L_3$). The third formed-feature 115 is positionally misaligned with reference to the positions of both the immediately adjacent second formed-feature 113 and the further underlying first formed-feature 111. However, in an example not shown, the third formed-feature 115 may be positionally misaligned with reference to immediately adjacent second formed-feature 113 but positionally aligned with reference to the first formed-feature 111.

The positional misalignment of each of the subsequently formed features (e.g., the second formed-feature 113 and the third formed-feature 115), both a layer-to-layer contact resistance and an overall level of contact resistance is increased. The overall level of contact resistance is continually increasing due to the misalignment of each feature within the subsequently formed layers with regard to the adjacent feature in the previously formed layer. At least a portion of the increased contact resistance may be a result of, for example, the reduced contact area of subsequently formed features. Although the shift of the features is shown in a single direction (lower-left to upper-right), the shift can occur in any direction or in multiple directions.

FIG. 1C shows a plan view 130 of the portion of the integrated-circuit device structure of FIG. 1B having progressively misaligned features, layer-to-layer, as indicated by the cross-sectional view of FIG. 1B. FIG. 1C is shown to include a portion of a first layer ($L_1$) 131, a portion of a second layer ($L_2$) 133, and a portion of a third layer ($L_3$) 135. The third layer 135 shows a feature 137 formed within the third layer 135. The feature 137 may be considered to be a plan view of the third formed-feature 115 of FIG. 1B. Each of the underlying layers, the first layer 131 and the second layer 133, also have features formed respectively therein (e.g., such as the first formed-feature 111 and the second formed-feature 113 of FIG. 1B).

FIG. 2A shows a plan view 200 of a portion of an integrated-circuit device structure having misaligned overlay occurring from a first layer ($L_1$) 201 to a second layer ($L_2$) 203. Depending upon a design rule for a given IC device, a critical dimension (CD) measurement can be made to make a determination as to whether the degree of overlay misalignment is within a pre-determined tolerance.

For example, consider a pre-determined tolerance level threshold of an x-direction overlay misalignment of less than or equal to 10 μm and a y-direction overlay misalignment of less than or equal to 10 μm, giving a total overly misalignment of up to 14.0 μm. If a first misalignment 207 is found to be off by 5 μm in a +x-direction and 5 μm in a +y-direction to a center location of a second-layer feature 205, for a total amount of the first misalignment 207 of approximately 7.1 μm, the misalignment is considered to be within the pre-determined tolerance shown above.

FIG. 2B shows a plan view 210 of the portion of the integrated-circuit device structure of FIG. 2A, having misaligned overlay occurring from the second layer ($L_2$) 203 of FIG. 2A to a third layer 211 ($L_3$). As with the first two layers of the portion of the device structure shown in FIG. 2A, and following the same or similar design rules for a given IC device between the second layer 203 and the third layer 211, a second CD measurement can be made to make a determination as to whether the degree of misalignment is within a pre-determined tolerance for the second and third layers. For example, if a second misalignment 215 is found to be off by 3 μm in a +x-direction and 3 μm in a +y-direction to a center location of a third-layer feature 213, for a total amount of the second misalignment 215 of approximately 4.2 μm, the misalignment is still considered to be within the pre-determined tolerance example of x<10 μm and y 10 μm.

However, the first misalignment 207 of approximately 7.1 μm from FIG. 2A must also be considered. Therefore, in this example, the amount of the first misalignment 207 and the second misalignment 215 are in the same direction (e.g., equal amounts in both the x-direction and y-direction on a layer-to-layer measurement). Therefore, a total amount of misalignment from the first layer ($L_1$) 201 to the third layer ($L_3$) is 8 μm in the +x-direction and 8 μm in the +y-direction, for a total of 11.3 μm.

FIG. 2C shows a plan view 230 of the portion of the integrated-circuit device structure of FIG. 2B, having misaligned overlay occurring from the third layer (L) of FIG. 2B to a fourth layer ($L_4$) 231. As with the first three layers of the portion of the device structure shown in FIGS. 2A and 2B, and following the same or similar design rules for a given IC device, a third CD measurement can be made to make a determination as to whether the degree of misalignment remains within a pre-determined tolerance for the third and fourth layers. For example, if a third misalignment 235 is found to be off by 4 μm in a +x-direction and 4 μm in a +y-direction to a center location of a fourth-layer feature 233, for a total amount of the third misalignment 235 of approximately 5.7 μm, the overlay misalignment may still be considered to be within the pre-determined tolerance.

However, the first misalignment 207 of approximately 7.1 μm from FIG. 2A, the second misalignment 215 of approximately of 4.2 μm, and the third misalignment 235 of approximately 5.7 μm are all considered cumulatively. Therefore, a total amount of misalignment from the first layer ($L_1$) 201 to the fourth layer ($L_4$) is 17.0 μm since each misalignment is in the same direction (e.g., equal amounts in both the x-direction and y-direction for layer-to-layer measurements). Therefore, in these examples where the misalignments are all in the same direction, the cumulative misalignment is directly additive. Consequently, the total overly misalignment may not be within the pre-determined tolerance level and the IC device may be considered as "no good" (NG), meaning that the device has failed to meet the pre-determined tolerance level threshold of less than or equal to x=10 μm and y=10 μm, for a total overly misalignment of 14.0 μm.

Therefore, at this point the substrate upon which this particular integrated circuit device was formed does not meet the pre-determined tolerance level. For example, if one or more layer-to-layer tolerance values are not met, an "offset-coordinate value" may be sent to a photolithographic exposure tool (e.g., a stepper as described in more detail with reference to FIG. 3, below) for future or subsequent substrate exposure and processing. In this example, if the misalignment is off by 4 μm in a +x-direction and 4 μm in a +y-direction, the offset-coordinate value can be used to instruct the photolithographic exposure tool to expose a given feature by providing a coordinate offset of 4 μm in a −x-direction and 4 μm in a −y-direction.

Additionally, at least one of three steps may now be considered: (1) the entire substrate may be scrapped; (2) the last layer may be reworked after sending the offset-coordinate value back to, for example, the photolithographic exposure tool that is exposing features on the substrate; or (3) mark each of the dice that fail to pass the overlay misalignment tolerance value. The affected die or dice marked as "bad" may then be discarded after singulation. If the entire substrate is scrapped, offset coordinates may be sent to the photolithographic stepper that is exposing features on the substrate for subsequent substrate processing. In this way, the amount of offset desired may be saved in a memory location within the process recipe for all future substrate for a given integrated circuit design. Examples of offset memory-locations are described with reference to FIG. 3.

In various embodiments, an end-user can be given an option to enable or disable layer-to-layer tolerance values for one or more layers with reference to a first layer, or for one layer to a subsequent layer with regard to tolerance values. For example, an end-user may desire good overlay to a previous layer and can tolerate a total-overlay drift with reference to a first layer, as long as the total-overlay drift is within a user-defined specification (e.g., a pre-determined total-overlay drift value). In other examples, an end-user may desire to maintain a good overlay with reference to a first layer, and tolerate a bit more of a pre-defined value from one layer to a second layer. Each of these examples is contemplated by the disclosed subject-matter. Further, a "factor-ratio" of additional compensation may be applied. For example, an end-user can change or pre-select an additional-compensation percentage if useful to bring a given layer or layers back within tolerance. In this example, if the additional compensation value is 3 μm, with a factor ratio set to 0.5, then a final compensation value will be 3 μm (0.5)=1.5 μm. These additional factors may also be incorporated into, for example, a signal being sent at a "no good" (NG) operation 341 as described with reference to FIG. 3, below.

With reference now to FIG. 2D, a plan view 250 is shown of the portion of the integrated-circuit device structure of FIG. 2A through FIG. 2C, having progressively misaligned overlays occurring from the first layer ($L_1$) 201 of FIG. 2A through the fourth layer ($L_4$) 231 of FIG. 2C.

FIG. 3 shows an example of a method incorporated into a fabrication environment 300 to reduce or eliminate misaligned overlay in accordance with various embodiments of the disclosed subject-matter. FIG. 3 is shown to include a photolithographic module 310, a measurement-analysis module 330, and a CD-measurement module and input module 350. The CD measurement module and input module 350 is shown to include at least one measurement tool 351 (which can be an optical-measurement tool, a laser-based measurement tool, an x-ray measurement tool, or any other type of measuring tool) and a user-input overlay-results module 353. In various embodiments, at least certain ones of the photolithographic module 310, the measurement-analysis module 330, and the CD-measurement module and input module 350 may all communicate with each other over one or more networks as described, for example, with reference to FIG. 5, below.

The photolithographic module 310 includes a substrate-input database 311, a photolithographic exposure tool 313, and a substrate-output database 315. The substrate-input database 311 may include one or more memory devices (e.g., solid-state memory, a hard drive, random-access memory (RAM), or any other type of volatile or non-volatile memory known in the art, for example, as described in more detail below, with reference to FIG. 5). The substrate-input database 311 can be used to store patterns and various coordinates (e.g., x- and y-coordinates with reference to a known location) where exposures are to be performed or scanned across a substrate by the photolithographic exposure tool 313. The substrate-input database 311 can be used to store the various coordinate locations on the substrate to drive the photolithographic exposure tool 313. Additionally, the substrate-input database 311 may be used to store at least a portion of other process recipes used to fabricate devices on the substrate.

As noted above, the photolithographic exposure tool 313 can include various types of, for example, projection-exposure systems, such as steppers and scanners. The substrate-output database 315 may include one or more memory devices (e.g., solid-state memory, a hard drive, random-access memory (RAM), or any other type of volatile or non-volatile memory known in the art) that are the same as or similar to the substrate-input database 311. The substrate-output database 315 may be used to store, for example, various coordinate offsets as received from other components within the fabrication environment 300 received from the measurement-analysis module 330 and the CD-measurement module and input module 350. In various embodiments, the substrate-input database 311 and the substrate-output database 315 may be different portions of a common database.

The measurement-analysis module 330 includes a first calculation-module 333, a second calculation-module 331, and a measurement-overlay database 335. The measurement-overlay database 335 receives measurement data and/or other input data from the CD-measurement and input module 350.

The first calculation-module 333 receives raw overlay-data from both the photolithographic exposure tool 313 and the second calculation-module 331. The first calculation-module 333 also supplies data to the second calculation-module 331. In embodiments, the first calculation-module 333 receives the raw overlay-data and converts it as needed in a form that is readable by other components within the fabrication environment 300.

The second calculation-module 331 calculates any offsets that may be desired for the photolithographic exposure tool 313 and creates a correction file, which may be stored in, for example, the substrate-output database 315 or another memory/storage location. The photolithographic exposure tool 313 may later apply the stored corrections if or when needed. In embodiments, the second calculation-module 331 may also calculate an accumulation or total overlay error as described with reference to FIG. 4, below. The accumulation or total overlay error may then be communicated to a host computer (not shown) if the value of the error exceeds a pre-defined threshold value. Consequently, the first calculation-module 333 and the second calculation-module 331 calculate and supply data to the photolithographic exposure tool 313, as described in more detail with reference to FIG. 4, below.

An output 337 from the first calculation-module 333 is shown graphically to, for example, feed correction values back to the first calculation-module 333 and/or the photolithographic exposure tool 313 at a "pass" operation 339. Based on a determination that values from the output 337 are outside of the pre-determined tolerance level threshold of an overlay misalignment, or a cumulative value of misalignment, a signal is sent at a "no good" (NG) operation 341 to the second calculation-module 331 and/or the photolithographic exposure tool 313. An operator (e.g., a process or line engineer) may then make a determination whether to rework a substrate undergoing fabrication at that point or simply scrap the substrate.

Further, upon reading and understanding the disclosed subject-matter, a person of ordinary skill in the art will recognize that the first calculation-module 333, the second calculation-module 331, and the measurement-overlay database 335 may comprise a single memory, comprising the database, and one or more hardware-based processors to perform calculations. The calculations may include, for example, a determination of accumulated overlay errors, comparisons of individual overlay errors with a pre-determined tolerance level threshold of an overlay misalignment, and possible corrections for the photolithographic exposure tool 313. Consequently, the various components shown in the measurement-analysis module 330 may be grouped together into a single component or may comprise individual components.

As noted above, the CD-measurement module and input module 350 is shown to include at least one measurement tool 351 (which can be an optical-measurement tool, a laser-based measurement tool, an x-ray measurement tool, or any other type of measuring tool) and a user-input overlay-results module 353. The measurement tool 351 may comprise one or more of various types of CD-measurement tools known in the art such as optical and mechanical profilometers, optical and electron microscopes, angle-resolved light scattering and scatterometry tools, or various other types of other manual inspection and automated-inspection tools known in the art. The CD measurements may be performed manually or automatically by the measurement tool 351. The user-input overlay-results module 353 provides an input to the CD-measurement and input module 350 where offline measurements may be input, for example, manually or automatically from another location or tool, to the fabrication environment 300.

FIG. 4 is an exemplary flowchart 400 of a method for aligning overlay features on initial and subsequent layers formed on a substrate. With continuing reference to FIG. 3, at operation 401, a first plurality of features is exposed on a first layer of a substrate. The features can include, for example, various type of vias including through-substrate vias (TSVs, including through-silicon vias if the substrate is a silicon wafer), conductive contact points for an RDL, as well as other planned features. An x-coordinate offset and a y-coordinate offset are measured respectively, for example, by the measurement tool 351, at operations 405, 407. Corrections, if needed, for the x-coordinate offset and the y-coordinate offset are fed back (e.g., prior to etching a feature), at operation 409 to the photolithographic module 310. In various embodiments, the corrections are fed back, more specifically, to the photolithographic exposure tool 313.

If more than one layer has been exposed, an accumulation overlay error may be determined at operation 411, as defined herein. A determination is made at operation 413 as to whether there are additional layers that are to be added to the substrate. If additional layers are to be added, the method of exemplary flowchart 400 loops back at operation 415 to operation 403 to reiterate at least portions of the method again. For example, for at least one additional layer of a plurality of additional layers formed over the first layer, all of portions of operation 405 through operation 411 may be performed again. If no additional layers are to be added to the substrate, a comparison of a total overly error to a pre-defined threshold value may be performed at operation 417.

Figure 5:
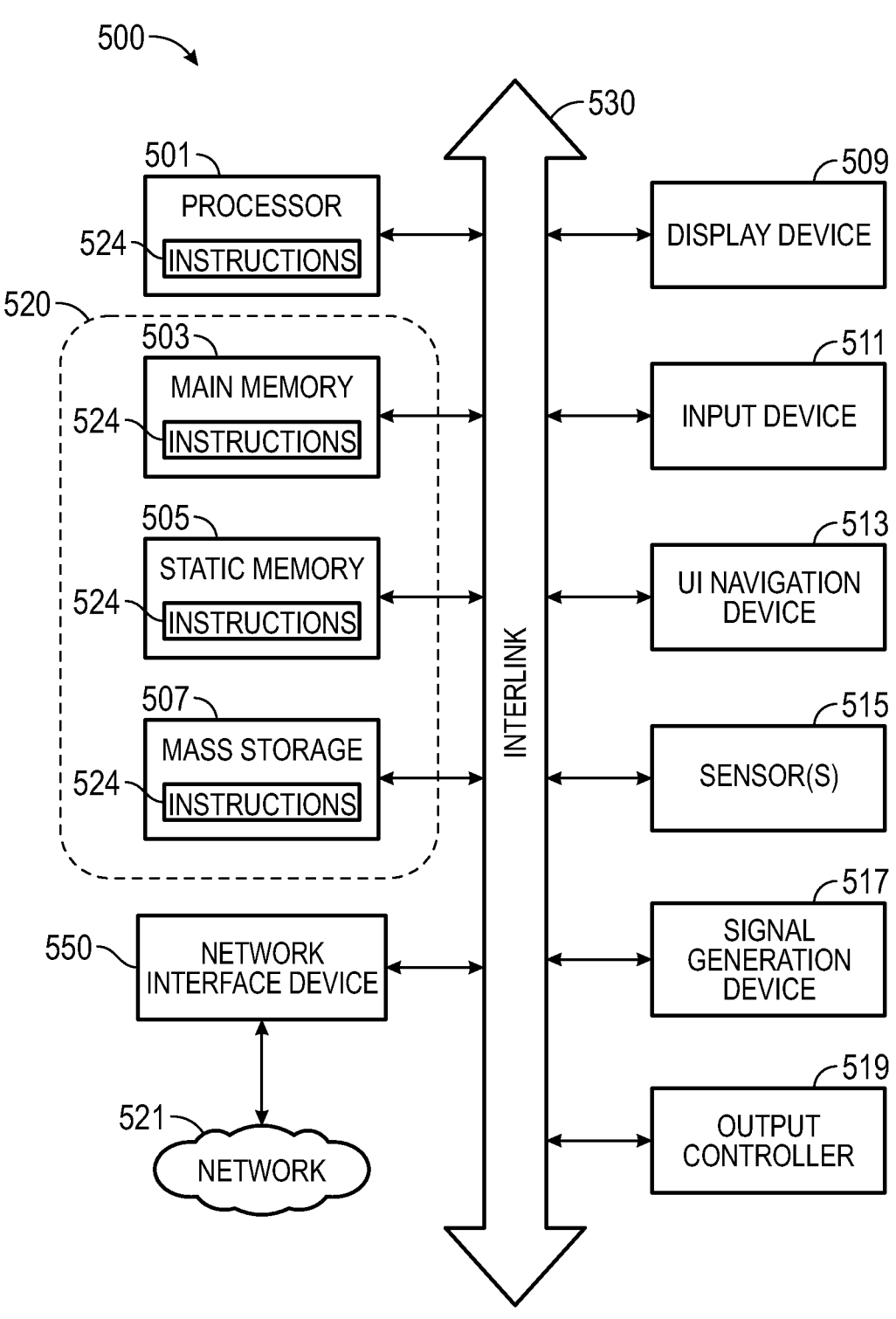
FIG. 5 shows a block diagram of an example comprising a machine upon which any one or more of the techniques (e.g., methodologies, calculations, etc.) discussed herein may be performed.

The methods and techniques shown and described herein can be performed using a portion or an entirety of a machine 500 as discussed below in relation to FIG. 5. FIG. 5 shows an exemplary block diagram comprising a machine 500 upon which any one or more of the techniques (e.g., methodologies, calculations, etc.) discussed herein may be performed. In various examples, the machine 500 may operate as a standalone device or may be connected (e.g., networked) to other machines.

In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet device, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware comprising the circuitry may include variably connected physical components (e.g., execution units, transistors, simple circuits, etc.) including a computer-readable medium physically modified (e.g., magnetically, electrically, such as via a change in physical state or transformation of another physical characteristic, etc.) to encode instructions of the specific operation. In connecting the physical components, the underlying electrical properties of a hardware constituent may be changed, for example, from an insulating characteristic to a conductive characteristic or vice versa. The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine 500 (e.g., computer system) may include a hardware-based processor 501 (e.g., a central processing unit (CPU), a graphics processing unit (GPU), a hardware processor core, or any combination thereof), a main memory 503 and a static memory 505, some or all of which may communicate with each other via an interlink 530 (e.g., a bus). The machine 500 may further include a display device 509, an input device 511 (e.g., an alphanumeric keyboard), and a user interface (UI) navigation device 513 (e.g., a mouse). In an example, the display device 509, the input device 511, and the UI navigation device 513 may comprise at least portions of a touch screen display. The machine 500 may additionally include a storage device 520 (e.g., a drive unit), a signal generation device 517 (e.g., a speaker), a network interface device 550, and one or more sensors 515, such as a global positioning system (GPS) sensor, compass, accelerometer, or other sensor. The machine 500 may include an output controller 519, such as a serial controller or interface (e.g., a universal serial bus (USB)), a parallel controller or interface, or other wired or wireless (e.g., infrared (IR) controllers or interfaces, near field communication (NFC), etc., coupled to communicate or control one or more peripheral devices (e.g., a printer, a card reader, etc.).

The storage device 520 may include a machine-readable medium on which is stored one or more sets of data structures or instructions 524 (e.g., software or firmware) embodying or utilized by any one or more of the techniques or functions described herein. The instructions 524 may also reside, completely or at least partially, within a main memory 503, within a static memory 505, within a mass storage device 507, or within the hardware-based processor 501 during execution thereof by the machine 500. In an example, one or any combination of the hardware-based processor 501, the main memory 503, the static memory 505, or the storage device 520 may constitute machine-readable media.

While the machine-readable medium is considered as a single medium, the term "machine-readable medium" may include a single medium or multiple media (e.g., a centralized or distributed database, and/or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, and optical and magnetic media. Accordingly, machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic or other phase-change or state-change memory circuits; magnetic disks, such as internal hard disks and removable disks; magneto-optical disks; and CD-ROM and DVD-ROM disks.

The instructions 524 may further be transmitted or received over a communications network 521 using a transmission medium via the network interface device 550 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., the Institute of Electrical and Electronics Engineers (IEEE) 802.22 family of standards known as Wi-Fi©, the IEEE 802.26 family of standards known as WiMax®), the IEEE 802.25.4 family of standards, peer-to-peer (P2P) networks, among others. In an example, the network interface device 550 may include one or more physical jacks (e.g., Ethernet, coaxial, or phone jacks) or one or more antennas to connect to the communications network 521. In an example, the network interface device 550 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

As used herein, the term "or" may be construed in an inclusive or exclusive sense. Further, other embodiments will be understood by a person of ordinary skill in the art based upon reading and understanding the disclosure provided. Moreover, the person of ordinary skill in the art will readily understand that various combinations of the techniques and examples provided herein may all be applied in various combinations.

Throughout this specification, plural instances may implement components, operations, or structures described as a single instance. Although individual operations are illustrated and described as separate operations, one or more of the individual operations may be performed concurrently, and, unless otherwise stated, nothing requires that the operations necessarily be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

Further, although not shown explicitly but understandable to a skilled artisan, each of the various arrangements, quantities, and number of elements may be varied (e.g., the number layers to be added to a substrate, the number of features per layer that are measured for x-coordinate and y-coordinate locations, the number of comparisons with pre-defined threshold values, etc.). Moreover, each of the examples shown and described herein is merely representative of one possible configuration or method and should not be taken as limiting the scope of the disclosure.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of operations, systems, and processes have been described, these methods, operations, systems, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The description provided herein includes illustrative examples, devices, and apparatuses that embody various aspects of the matter described in this document. In the description, for purposes of explanation, numerous specific details are set forth in order to provide an understanding of various embodiments of the matter discussed. It will be evident however, to those of ordinary skill in the art, that various embodiments of the disclosed subject-matter may be practiced without these specific details. Further, well-known structures, materials, and techniques have not been shown in detail, so as not to obscure the various illustrated embodiments. As used herein, the terms "about," "approximately," and "substantially" may refer to values that are, for example, within +10% of a given value or range of values.

The Following Numbered Examples are Specific Embodiments of the Disclosed Subject-Matter Example 1: A method for correcting overlay errors in a multi-layer process. In embodiments, the method may include exposing a first plurality of features on a first layer of a substrate with the exposing being performed by a photolithographic exposure tool. In embodiments, for at least one of a plurality of additional layers formed over the first layer: measuring an x-coordinate offset and a y-coordinate offset of a subsequent plurality of features on a subsequent layer with reference to a same location of at least one of the first plurality of features and defined x-coordinates and y-coordinates for the first plurality of features on the substrate; and feeding back correction information for the x-coordinate offset and the y-coordinate offset of the subsequent plurality of features to the photolithographic exposure tool prior to exposing a further subsequent layer.

Example 2: The method of Example 1, wherein the first plurality of features and the subsequent plurality of features include conductive contact-points of redistribution layers (RDLs).

Example 3: The method of any of the preceding Examples, wherein the first plurality of features and the subsequent plurality of features comprise a plurality of interconnect vias.

Example 4: The method of any of the preceding Examples, wherein the measuring of the x-coordinate offset and the y-coordinate offset of at least a portion of the subsequent plurality of features from the exposed locations of the plurality of features is performed automatically.

Example 5: The method of any of the preceding Examples, further comprising using user-input overlay results in addition to the measuring of the x-coordinate offset and the y-coordinate offset of at least a portion of the subsequent plurality of features.

Example 6: The method of any of the preceding Examples, further comprising calculating a value of a correction for the x-coordinate offset and the y-coordinate offset based on shifting the x-coordinate offset and the y-coordinate offset of a subsequent plurality of features to a center location of exposed locations of the first plurality of features.

Example 7: The method of any of the preceding Examples, further comprising comparing a total overlay error for a total number of n layers to a pre-defined threshold value for the n layers.

Example 8: The method of Example 7, further including based on a determination the total overly error is greater than the pre-defined threshold value, reworking one or more layers to provide a total overlay value that is less than or equal to the pre-defined threshold value.

Example 9: The method of any of the preceding Examples, further including determining an accumulation overlay-error after forming each layer on the substrate; and making a determination whether the accumulation overlay-error is less than or equal to a pre-defined threshold value determined for each layer.

Example 10. A system to correct overlay errors in a multi-layer process. In various embodiments, the system may include a photolithographic exposure tool to expose a first plurality of features on a first layer of a substrate. In embodiments, for at least one of a plurality of additional layers formed over the first layer: a metrology-based measurement tool is used to measure an x-coordinate offset and a y-coordinate offset of a subsequent plurality of features on a subsequent layer with reference to a same location of at least one of exposed locations of the first plurality of features and defined x-coordinates and y-coordinates for the first plurality of features on the substrate; and at least one calculation module to feed corrections for the x-coordinate offset and the y-coordinate offset of the subsequent plurality of features back to the photolithographic exposure tool prior to exposing a further subsequent layer.

Example 11. The system of Example 10, wherein the measurements of the x-coordinate offset and the y-coordinate offset of at least a portion of the subsequent plurality of features from the exposed locations of the plurality of features are to be performed automatically.

Example 12: The system of any one of Examples 10 or 11, further including using user-input overlay results in addition to the measurements of the x-coordinate offset and the y-coordinate offset of at least a portion of the subsequent plurality of features.

Example 13. The system of any one of the preceding Examples 10 through 12, further including calculating a value of a correction for the x-coordinate offset and the y-coordinate offset based on shifting the x-coordinate offset and the y-coordinate offset of a subsequent plurality of features to a center location of exposed locations of the first plurality of features.

Example 14: The system of any one of the preceding Examples 10 through 13, further comprising comparing a total overlay error for a total number of n layers to a pre-defined threshold value for the n layers.

Example 15: The system of Example 14, further including, based on a determination the total overly error is greater than the pre-defined threshold value, reworking one or more layers to provide a total overlay value that is less than or equal to the pre-defined threshold value.

Example 16: The system of any one of the preceding Examples 10 through 15, further including, determining an accumulation overlay-error after forming each layer on the substrate; and making a determination whether the accumulation overlay-error is less than or equal to a pre-defined threshold value determined for each layer.

Example 17: The method or system of any of the preceding Examples, wherein the Examples are also applicable substrate-to-substrate.

What is claimed:

1. A method for correcting overlay errors in a multi-layer process, the method comprising:

receiving, at a measuring tool, a substrate with a first plurality of features provided at a plurality of locations on a first layer;

measuring an x-coordinate offset and a y-coordinate offset of the first plurality of features on the first layer;

receiving, at a measuring tool, the substrate with a second plurality of features on a second layer;

measuring an x-coordinate offset and a y-coordinate offset of the second plurality of features on the second layer with reference to a select location of the plurality of locations associated with at least one of the first plurality of features and defined x-coordinates and y-coordinates for the at least one of first plurality of features on the substrate; and feeding back corrections for the x-coordinate offset and the y-coordinate offset of the second plurality of features to a photolithographic exposure tool prior to exposing a third layer.

2. The method of claim 1, wherein the first plurality of features and the second plurality of features include conductive contact-points of redistribution layers (RDLs).

3. The method of claim 1, wherein the first plurality of features and the second plurality of features comprise a plurality of interconnect vias.

4. The method of claim 1, wherein the measuring of the x-coordinate offset and the y-coordinate offset of at least a portion of the second plurality of features from the exposed locations of the first plurality of features is performed automatically.

5. The method of claim 1, further comprising using user-input overlay results in addition to the measuring of the x-coordinate offset and the y-coordinate offset of at least a portion of the second plurality of features.

6. The method of claim 1, further comprising calculating a value of a correction for the x-coordinate offset and the y-coordinate offset based on shifting the x-coordinate offset and the y-coordinate offset of the second plurality of features to a center location of exposed locations of the first plurality of features.

7. The method of claim 1, further comprising comparing a total overlay error for a total number of n layers to a pre-defined threshold value for the n layers.

8. The method of claim 7, further comprising:

based on a determination that the total overlay error is greater than the pre-defined threshold value, reworking one or more layers to provide a total overlay value that is less than or equal to the pre-defined threshold value.

9. The method of claim 1, further comprising:

determining an accumulation overlay-error after forming each layer on the substrate; and making a determination whether the accumulation overlay-error is less than or equal to a pre-defined threshold value determined for each layer.

10. A system to correct overlay errors in a multi-layer process, the system comprising:

a measurement tool configured to:

receive a substrate with a first plurality of features provided at a plurality of locations on a first layer;

measure an x-coordinate offset and a y-coordinate offset of the first plurality of features on the first layer; and send correction information to a photolithographic exposure tool;

wherein the measurement tool is to receive the substrate with a second plurality of features on a second layer and to measure an x-coordinate offset and a y-coordinate offset of the second plurality of features on the second layer with reference to a select location of the plurality of locations associated with at least one of the first plurality of features and defined x-coordinates and y-coordinates for the at least one of first plurality of features on the substrate and to send the correction information for the x-coordinate offset and the y-coordinate offset of the second plurality of features back to the photolithographic exposure tool prior to exposing a third layer.

11. The system of claim 10, wherein the measurements of the x-coordinate offset and the y-coordinate offset of at least a portion of the second plurality of features from the exposed locations of the plurality of features are to be performed automatically.

12. The system of claim 10, further comprising using user-input overlay results in addition to the measurements of the x-coordinate offset and the y-coordinate offset of at least a portion of the second plurality of features.

13. The system of claim 10, further comprising calculating a value of a correction for the x-coordinate offset and the y-coordinate offset based on shifting the x-coordinate offset and the y-coordinate offset of the second plurality of features to a center location of exposed locations of the first plurality of features.

14. The system of claim 10, further comprising comparing a total overlay error for a total number of n layers to a pre-defined threshold value for the n layers.

15. The system of claim 14, further comprising:

based on a determination that the total overlay error is greater than the pre-defined threshold value, reworking one or more layers to provide a total overlay value that is less than or equal to the pre-defined threshold value.

16. The system of claim 10, further comprising:

determining an accumulation overlay-error after forming each layer on the substrate; and making a determination whether the accumulation overlay-error is less than or equal to a pre-defined threshold value determined for each layer.

17. The method of claim 1, further comprising:

exposing a third plurality of features on the third layer based on the corrections for the x-coordinate offset and the y-coordinate offset.

18. The method of claim 1, wherein the select location is a center location of the at least one of the first plurality of features.

19. The system of claim 10, wherein the photolithographic exposure tool is configured to:

expose a third plurality of features on the third layer based on the corrections for the x-coordinate offset and the y-coordinate offset.

20. The system of claim 10, wherein the select location is a center location of the at least one of the first plurality of features.

* * * * *